US012633943B2

(12) United States Patent
Kaynak et al.

(10) Patent No.: US 12,633,943 B2
(45) Date of Patent: May 19, 2026

(54) ROW WEIGHT ADJUSTMENT IN TWO-LEVEL LOW-DENSITY PARITY-CHECK (LDPC) ERROR CORRECTION

(71) Applicant: MICRON TECHNOLOGY, INC., Boise, ID (US)

(72) Inventors: Mustafa N. Kaynak, San Diego, CA (US); Eyal En Gad, Fremont, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 65 days.

(21) Appl. No.: 18/893,471

(22) Filed: Sep. 23, 2024

(65) Prior Publication Data

US 2026/0088832 A1     Mar. 26, 2026

(51) Int. Cl.
*H03M 13/11*          (2006.01)

(52) U.S. Cl.
CPC ...... *H03M 13/116* (2013.01); *H03M 13/1105* (2013.01)

(58) Field of Classification Search
CPC ............ H03M 13/116; H03M 13/255; H03M 13/1165; H03M 13/1102; H03M 13/1148; H03M 13/6393; H03M 13/1177; H03M 13/1154; H03M 13/1162; H03M 13/1151; H03M 13/1105
USPC ......................................... 714/752, 800–805
See application file for complete search history.

(56) References Cited

U.S. PATENT DOCUMENTS

| | | | |
|---|---|---|---|
| 7,370,265 B2 | 5/2008 | Shen et al. | |
| 8,230,298 B2 | 7/2012 | Tran et al. | |
| 8,230,312 B1 | 7/2012 | Yeo et al. | |
| 8,321,752 B1 * | 11/2012 | Yang ................. | H03M 13/2906 |
| | | | 714/779 |
| 8,549,387 B2 | 10/2013 | Lee | |
| 9,509,342 B2 | 11/2016 | Vernon | |
| 10,853,187 B2 | 12/2020 | Arslan et al. | |
| 11,075,650 B1 * | 7/2021 | Dow .................. | H03M 13/1182 |
| 11,108,410 B1 * | 8/2021 | Walke ................. | H03M 13/116 |
| 11,394,403 B1 * | 7/2022 | En Gad ............. | H03M 13/6516 |
| 11,881,871 B1 * | 1/2024 | Zhang ................ | H03M 13/1128 |

(Continued)

*Primary Examiner* — Shelly A Chase
*Assistant Examiner* — Osman M Alshack
(74) *Attorney, Agent, or Firm* — Tarolli, Sundheim, Covell & Tummino LLP

(57)          ABSTRACT

A method for error correction includes reading, by a memory controller, a first-level codeword from a memory device, the first-level codeword having user data and first-level parity data. The method includes decoding, by the memory controller responsive to determining the first-level codeword contains errors, the first-level codeword using a first-level low-density parity-check (LDPC) decoder employing a first-level H matrix having a portion with reduced column weights to reduce an average row weight for the first-level H matrix. Responsive to the first-level LDPC decoder failing to correct the errors in the first-level codeword, the memory controller decodes a second-level codeword using a second-level LDPC decoder employing a second-level H matrix that includes a portion with increased column weights to increase an average row weight of a second-level of the second-level H matrix. The second-level codeword having the user data, the first-level parity data and second-level parity data.

20 Claims, 5 Drawing Sheets

(56)         References Cited

U.S. PATENT DOCUMENTS

| | | | | |
|---|---|---|---|---|
| 2013/0173982 | A1* | 7/2013 | Moon | H03M 13/3761 |
| | | | | 714/752 |
| 2018/0157551 | A1* | 6/2018 | Ryabinin | G06F 1/3206 |
| 2018/0159553 | A1* | 6/2018 | Sharon | H03M 13/1137 |
| 2018/0159555 | A1* | 6/2018 | Ryabinin | H03M 13/3715 |
| 2018/0159557 | A1* | 6/2018 | Shinohara | H03M 13/2792 |
| 2018/0246783 | A1* | 8/2018 | Avraham | H03M 13/27 |
| 2024/0128985 | A1* | 4/2024 | Jun | H03M 13/6575 |
| 2024/0313803 | A1* | 9/2024 | Zhang | G06F 11/1076 |

* cited by examiner

200

| | | PLANE 0 | | | |
|---|---|---|---|---|---|
| | | CW0 | CW1 | CW2 | CW3 |
| SB0 | LP | 0 | 1 | 2 | 3 |
| | UP | 4 | 5 | 6 | 7 |
| | XP | 8 | 9 | 10 | PCW |
| SB1 | LP | 0 | 1 | 2 | 3 |
| | UP | 4 | 5 | 6 | 7 |
| | XP | 8 | 9 | 10 | PCW |

FIG. 2

ROW WEIGHT ADJUSTMENT IN TWO-LEVEL LOW-DENSITY PARITY-CHECK (LDPC) ERROR CORRECTION

TECHNICAL FIELD

This disclosure relates to decoding data with a two-level low-density parity-check (LDPC) matrix that has adjusted row weights.

BACKGROUND

A memory sub-system includes a memory device designed for data storage. These memory devices are implemented as non-volatile and volatile memory devices in various examples. In some such examples, a host system employs a memory sub-system for the purposes of storing data on the memory devices and for retrieving data from the memory devices.

Low-density parity-check (LDPC) codes are a class of linear error-correcting codes used in data storage, such as non-volatile memory sub-systems. LDPC codes are defined by sparse parity-check matrices, known as H matrices, which specify the relationships between data bits and parity-checks. The LDPC codes operate by encoding user data with additional parity bits, forming codewords that can be decoded to correct errors that may occur during storage or transmission. LDPC decoding involves iterative algorithms that analyze the codeword and estimate the most likely values for the data bits based on the parity-check equations defined by the H matrix. The effectiveness of LDPC codes is influenced by factors such as the structure of the H matrix, including column and row weights, which affect the code's error correction capability and decoding efficiency. LDPC codes are valued for the ability to approach channel capacity, offering a favorable trade-off between error correction performance and implementation complexity.

BRIEF DESCRIPTION OF THE DRAWINGS

FIG. 2 illustrates a chart that represents an example of a portion of the memory device.

DETAILED DESCRIPTION

Figure 1:
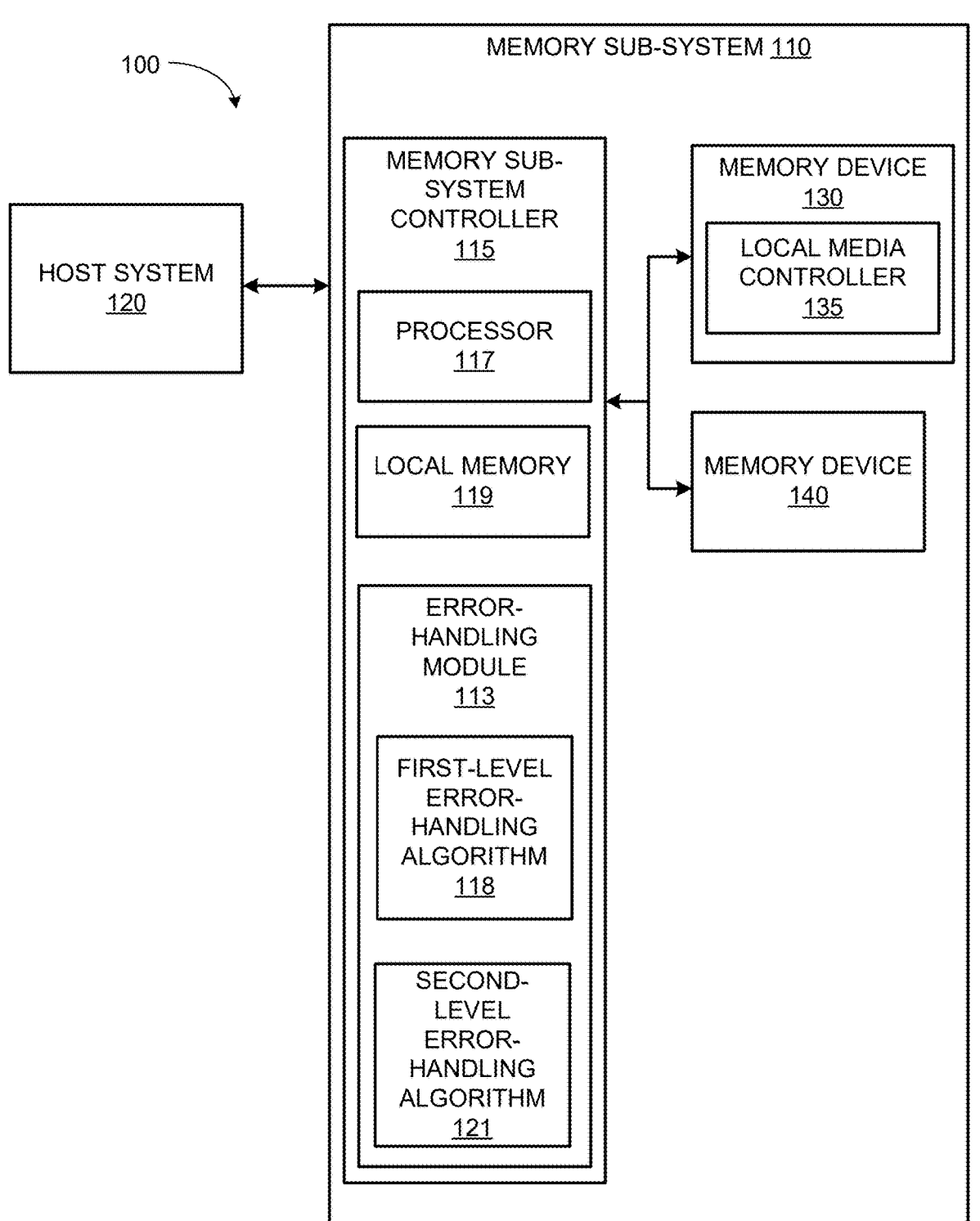
FIG. 1 illustrates a system for decoding data from a memory sub-system.

This description relates to enhancing the error correction capabilities of two-level Low-density parity-check (LDPC) codes within non-volatile memory sub-systems, such as Not-AND (NAND) memory systems. This enhancement addresses challenges associated with non-uniform row weight distribution between first and second-levels of LDPC codes, which can diminish error correction performance, particularly for weaker wordlines susceptible to higher error rates. The present description provides strategic adjustments to row weights of a parity-check H matrix (sometimes referred to more simply as an H matrix) by manipulating column weights and the distribution of non-zero bits in the H matrix to decrease the column weight of the first-level H matrix and to increase the column weight of the second-level H matrix, thereby enhancing the reliability and performance of the non-volatile memory sub-systems.

More generally, some examples of a memory sub-system include high density non-volatile memory devices where retention of data is desired during intervals of time where no power is supplied to the memory device. One example of non-volatile memory devices is a NAND memory device. A non-volatile memory device is a package that includes a die(s). Each such die can include a plane(s). For some types of non-volatile memory devices (e.g., NAND memory devices), each plane includes a set of physical blocks, and each physical block includes a set of pages. Each page includes a set of memory cells, which are commonly referred to as cells. A cell is an electronic circuit that stores information. A cell stores at least one bit of binary information and has various logic states that correlate to the number of bits being stored. The logic states are be represented by binary values, such as '0' and '1', or as combinations of such values, such as '00', '01', '10' and '11'.

A memory device includes multiple cells arranged in a two-dimensional or a three-dimensional grid. In some examples, memory cells are formed on a silicon wafer in an array of columns connected by conductive lines (also referred to as bitlines, or BLs) and rows connected by conductive lines (also referred to as wordlines or WLs). A wordline has a row of associated memory cells in a memory device that are used with a bitline or multiple bitlines to generate the address of each of the memory cells. The intersection of a bitline and a wordline defines an address of a given memory cell.

A block refers to a unit of the memory device used to store data. In various examples, the unit could be implemented as a group of memory cells, a wordline group, a wordline or as individual memory cells. Multiple blocks are grouped together to form separate partitions (e.g., planes) of the memory device to enable concurrent operations to take place on each plane. A solid-state drive (SSD) is an example of a memory sub-system that includes a non-volatile memory device(s) and a memory sub-system controller to manage the non-volatile memory devices.

The memory sub-system controller is configured/programmed to encode the host and other data, as part of a write operation, into a format for storage at the memory device(s). Encoding refers to a process of generating parity bits from embedded data (e.g., a sequence of binary bits) using an error correction code (ECC) and combining the parity bits to the embedded data to generate an LDPC codeword. LDPC encoding refers to an encoding method that utilizes an LDPC code to generate the parity bits, which can be referred to as a parity portion. User data (e.g., embedded data) is combined with the parity portion to form the LDPC codeword, which may alternatively be referred to simply as a codeword.

The LDPC code is defined by, among other things, a sparse parity-check matrix, alternatively referred to as an LDPC matrix or as an H matrix, denoted as $\overline{H}$. Each row of the H matrix embodies a linear constraint imposed on a designated subset of data bits. Entries within the H matrix, either '0' or '1', signify the participation of individual data bits in each constraint. Stated differently, each row of the H matrix represents a parity-check equation, and each column corresponds to a bit in the codeword. During encoding, the user data (embedded data) is multiplied by the generator matrix which is the inverse of the H matrix associated with a chosen LDPC code to generate parity bits, which are referred to as the parity portion. Alternatively, encoding can be executed without a matrix multiplication. In general, LDPC codes come in two main types based on the column weight (CW) of the H matrix, which is the number of parity bits with which each codeword bit interacts. Regular LDPC codes have a fixed CW for all codeword bits, while irregular LDPC codes allow for varying CWs. The generated parity portion is appended to the user data to generate the codeword (LDPC codeword). Thus, the codeword includes the user data and the parity portion, allowing for identification and rectification of errors. The codeword is storable at the memory device(s) of the memory sub-system.

Additionally, the memory sub-system controller can decode codewords, as part of a read operation, stored at the memory device(s) of the memory sub-system. Decoding refers to a process of reconstructing the original user data (e.g., sequence of binary bits embedded in the codeword) from the codeword received from storage at the memory device(s). LDPC decoding refers to a decoding method that utilizes the LDPC code to reconstruct the original user data (embedded data).

Initially, during LDPC decoding, the codeword (an LDPC codeword) is compared with the expected relationships encoded in the H matrix. In particular, the codeword is multiplied by a transpose of the H matrix associated with the LDPC code used to encode the codeword. This operation can also be performed without making a matrix multiplication by sequentially checking each parity using XOR operations. The result of the multiplication produces a vector (e.g., a syndrome vector), in which each element corresponds to a specific parity-check equation in the sparse parity-check matrix. A syndrome vector value of zero signifies that the corresponding parity-check equation is satisfied (e.g., no errors or having even number of bit errors in the parity-check equation), and a syndrome vector with a non-zero value indicates potential errors impacting the bits involved in the corresponding parity-check equation. Potential errors, for example, may be due to the bits involved in the corresponding parity-check equation being flipped due to noise, interference, distortion, bit synchronization errors or errors from the media itself (both intrinsic and extrinsic). For example, a bit that may have originally been stored as a '0' may be flipped to a '1' or vice versa. The decoding process for LDPC codes are based on the syndrome vector, such as LDPC codes used in the memory sub-systems.

In response to detection of the potential errors, an algorithm of the LDPC decoding, such as a MinSum (alternatively referred to as min-sum) algorithm, iteratively analyzes the LDPC codeword and estimates the most likely values for the data bits. In particular, the algorithm of the LDPC decoding (e.g., decoding algorithm) is initialized with either hard decisions and/or soft decisions of the LDPC codeword. Hard decisions refer to binary decisions made about the LDPC codeword, where each bit is classified as either '0' or '1' based on a threshold. Soft decisions refer a likelihood or confidence score indicating how likely each bit is to be classified as either '0' or '1'. In some instances, soft decisions may be represented as a log-likelihood ratio (LLR) set, in which each LLR of the LLR set is a value that indicates a likelihood or confidence score of a bit of the LDPC codeword to be classified as either '0' or '1'. Moreover, in some examples, the hard decisions are represented with a selected value of the LLR set. The LLR is a ratio of the probabilities of receiving a particular signal given the bit is '0' versus the bit being '1' or vice versa. A positive LLR (e.g., a positive value) indicates that '0' is a more likely decision, whereas a negative LLR (e.g., a negative value) indicates that '1' is a more likely decision. The magnitude of the LLR indicates the confidence in this decision. A higher magnitude (or larger value) suggests higher confidence in the decision.

Two-level LDPC coding is an error correction scheme designed to enhance the reliability and performance of data storage and communication systems, particularly in environments that employ NAND flash memory where error rates can vary significantly. Two-level LDPC involves using two sets or "levels" of LDPC codes, each tailored to different error conditions or reliability requirements within the device. This approach allows for adaptation to varying error characteristics across different parts of the memory array or during different operational conditions.

In an example two-level LDPC scheme, a first-level LDPC decoder is employable for general error correction across most wordlines, providing adequate correction for standard error rates under normal conditions, including wordlines that are categorized as strong wordlines or medium wordlines (wherein "strong" and "medium" indicate a propensity of errors). However, for weak wordlines that are inherently more prone to errors (e.g., due to physical defects or degradation over time) a second-level LDPC decoder with stronger error correction capabilities is employed. This second-level LDPC decoder handles higher error rates and more complex error patterns, ensuring data integrity where the first-level might be insufficient. By employing such a tiered approach, two-level LDPC schemes can be tuned for both performance and reliability, using more complex and computationally intensive error correction when needed, thereby balancing efficiency and robustness. In particular, only a select set of weak wordlines uses second-level LDPC. The parity portion for the first-level LDPC is stored in the same codeword as the user data. For the second-level LDPC, the additional parity for multiple codewords on the weak wordline is gathered and stored on the same wordline in a different page, and/or on a different wordline in some examples. This codeword is referred to as a parity codeword because the user data portion of this codeword is made of second-level parity for multiple codewords on the weak wordline. Therefore, accessing second-level parity includes an additional page read.

To initiate the decoding process, a controller (e.g., a memory sub-system controller) executes a read of a first-level codeword [U,P1] (codeword-1) from a memory device (e.g., NAND flash memory). The first-level codeword includes user data [U] and a first-level parity [P1] (e.g., a first-level parity portion) formed of parity bits. Throughout this description, the nomenclature of a square bracket [ ], such as the reference to the "first-level codeword [U,P1]" indicates the constituent components of a particular data structure. Additionally, the non-volatile memory device stores the second-level parity [P2] for the first-level codeword, [U,P1] in the different page.

The controller calculates a syndrome vector which indicates that the codeword includes errors. If the syndrome vector is equal to zero, it is presumed that the codeword contains no errors. Accordingly, in this situation, the first-level codeword [U,P1] can be stored in local memory, such that user data [U] can be extracted from the first-level codeword [U,P1] and provided to an external system. However, in situations where the syndrome vector is not equal to zero, the first-level codeword [U,P1] has errors.

Responsive to detecting the presence of errors, the controller initiates an error-handling algorithm. The error-handling algorithm executes a first-level LDPC decoder with a first-level H matrix on the read of the first-level codeword [U,P1]. In situations where the first-level LDPC decoder is able to correct the errors in the first-level codeword [U,P1] without exceeding a first-level decoding threshold, the controller stores the (corrected) first-level codeword [U,P1] in the local memory, such that user data [U] from the first-level codeword [U,P1] can be provided to the external system. The first-level decoding threshold could define a maximum number of iterations, a computational time, etc.

Conversely, if the error-handling algorithm is unable to correct the errors in the first-level codeword [U,P1], the controller reads the second-level parity [P2], stored separately from the first-level codeword [U,P1]. The memory controller combines data from the first-level parity [P1] and [P2] to form a second-level codeword [U,P1, P2] that is input into a second-level LDPC decoder with a second-level H matrix to enables a more comprehensive error correction, effectively enhancing the likelihood of restoring data integrity. The second-level LDPC decoder can be the same decoder used for first-level LDPC decoder. This two-level approach allows the memory controller to adapt to varying error conditions, ensuring that even when faced with challenging error patterns or degraded memory cells, the memory sub-system can maintain data accuracy and reliability.

To implement two-level LDPC correction, a two-level H matrix is employed. The first-level of the H matrix (the first-level H matrix) is employable with the first-level parity [P1] that has a L1 (first-level) number of parity bits, and the second-level of the H matrix (the second-level H matrix) is employable with the second-level parity [P2] that has an L2 (second-level) number of parity bits, wherein L1 and L2 are positive integers. Stated differently, the first-level parity [P1] has L1 number of bits and the second-level parity [P2] has L2 number of bits. However, in many instances, there is a non-uniform distribution of row weights (RW) between the first-level H matrix employed for the L1 number of parity bits and the second-level H matrix employed for the L2 number of parity bits. In previous approaches, this disparity in row weights leads to suboptimal error correction performance, particularly impacting the weaker wordlines in non-volatile memory that are more susceptible to errors. In particular, the second-level of the H matrix employed for the L2 parity bits often has a lower row weight compared to the first-level of the H matrix employed for the L1 parity bits. This lower row weight of the second-level of the H matrix resultant in each parity-check at this level influencing fewer bits (compared to the first-level of the H matrix), reducing the overall effectiveness of error correction for the bits of a the second-level codeword [U,P1,P2] that are most in need of robust correction capabilities. The non-uniform row weight distribution compromises the error correction capability of the second-level LDPC decoder and can reduce the overall reliability and performance of the memory sub-system.

To curtail an impact of the non-uniform row weights, the memory controller can adjust and tune the row weights of the first-level of the H matrix and the second-level of the H matrix by manipulating the column weights (CW) and the distribution of non-zero bits in the first-level of the H matrix and the second-level of the H matrix. In particular, the column weights of the first-level of the H matrix and the second-level of the H matrix are manipulated in a manner that decreases an average row weight of the first-level of the H matrix and increases an average row weight of the second-level of the H matrix. Accordingly, this adjustment to the column weights aims to reduce a disparity of the average row weight of the first-level of the H matrix and the second-level of the H matrix to enhance the error correction effectiveness and ensuring higher data integrity across wordlines of memory devices of the memory sub-system, including wordlines that are weaker and more error-prone.

FIG. 1 illustrates a system 100 that includes a memory sub-system 110 that can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card and a hard disk drive (HDD). Examples of memory modules include a dual in-line memory module (DIMM), a small outline DIMM (SO-DIMM) and various types of non-volatile dual in-line memory modules (NVDIMMs).

The system 100 can be a computing device such as a desktop computer, laptop computer, network server, mobile device, a vehicle (e.g., airplane, drone, train, automobile or other conveyance), Internet of Things (IoT) enabled device, embedded computer (e.g., one included in a vehicle, industrial equipment or a networked commercial device) or such computing device that includes memory and a processing device. The system 100 can include a host system 120 that is coupled to one or more memory sub-systems 110. In some examples, the host system 120 is coupled to different types of the memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller) and a storage protocol controller (e.g., PCIe controller, SATA controller, CXL controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a compute express link (CXL) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory device(s) 130) when the memory sub-system 110 is coupled with the host system 120 by the physical host interface (e.g., PCIe or CXL bus). The physical host interface can provide an interface for passing control, address, data and other signals between the memory sub-system 110 and the host system 120. FIG. 1 illustrates a memory sub-system 110 as an example. In general, the host system 120 can access multiple memory sub-systems via a same communication connection, multiple separate communication connections and/or a combination of communication connections.

The memory device 130 and the memory device 140 are implemented as non-transitory computer readable media. The memory device 130 and the memory device 140 can include any combination of the different types of non-volatile memory devices and/or volatile memory devices. The volatile memory devices (e.g., the memory device 140) can be, but are not limited to, random access memory (RAM), such as dynamic random access memory (DRAM) and synchronous dynamic random access memory (SDRAM).

Some examples of non-volatile memory devices (e.g., memory device(s) 130) include Not-AND (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory device(s) 130 include one or more arrays of memory cells. One type of memory cell, for example, single level cells (SLC) can store one bit per cell. Other types of memory cells, such as multi-level cells (MLCs), triple level cells (TLCs) and quad-level cells (QLCs), and penta-level cells (PLC's) or higher, can store multiple bits per cell. In some examples, each of the memory devices 130 can include one or more arrays of memory cells such as SLCs, MLCs, TLCs, QLCs or some combination thereof. In some examples, a particular memory device can include an SLC portion, an MLC portion, a TLC portion and/or a QLC portion of memory cells. The memory cells of the memory devices 130 can be grouped as pages that can refer to a logical unit of the memory device used to store data. In some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), not-OR (NOR) flash memory, electrically erasable programmable read-only memory (EEPROM), etc.

A memory sub-system controller 115 (or controller 115 for simplicity) communicates with the memory device(s) 130 to perform operations such as reading data, writing data or erasing data at the memory devices 130 and other such operations. The memory sub-system controller 115 can include hardware such as one or more integrated circuits and/or discrete components, a buffer memory or some combination thereof. The hardware can include a digital circuitry with dedicated (e.g., hard-coded) logic to perform the operations described herein. The memory sub-system controller 115 can be a microcontroller, special purpose logic circuitry (e.g., a field programmable gate array (FPGA), an application specific integrated circuit (ASIC), etc.) or other suitable processor.

The memory sub-system controller 115 can include a processing device, which includes one or more processors (e.g., the processor 117), configured to execute instructions stored in a local memory 119. In the illustrated example, the local memory 119 of the memory sub-system controller 115 includes an embedded memory configured to store instructions for performing various processes, operations, logic flows and routines that control operation of the memory sub-system 110, including handling communications between the memory sub-system 110 and the host system 120. The local memory 119 is a non-transitory computer-readable medium.

In some examples, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another example, a memory sub-system 110 does not include a memory sub-system controller 115 and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations and address translations between a logical address (e.g., a logical block address (LBA), namespace) and a physical address (e.g., physical block address) that are associated with the memory devices 130. The memory sub-system controller 115, for example, may employ a Flash Translation Layer (FTL) to translate logical addresses to corresponding physical memory addresses, which can be stored in one or more FTL mapping tables. In some instances, the FTL mapping table can be referred to as a logical-to-physical (L2P) mapping table storing L2P mapping information. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. For example, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some examples, the memory devices 130 include local media controllers 135 that operate in concert with the memory sub-system controller 115 to execute operations on one or more memory cells of the memory devices 130. An external controller (e.g., the memory sub-system controller 115) can externally manage the memory device 130 (e.g., perform media management operations on the memory device 130). In some examples, the memory sub-system 110 is a managed memory device, which is a raw memory device 130 having control logic (e.g., local media controller 135) on the die and a controller (e.g., the memory sub-system controller 115) for media management within the same memory device package. An example of a managed memory device is a managed NAND (MNAND) device.

The memory device 130 and the memory device 140 are structured to include wordlines. Wordlines are addressable wiring lines that connect and control a row of memory cells in the memory device 130 and the memory device 140. Each wordline addresses the cells in a corresponding row con- temporaneously, enabling operations such as reading, writ- ing and erasing data. The memory device 130 and the memory device 140 can be organized into an array of cells arranged in blocks, with each block containing multiple pages. The cells in a page are connected by these wordlines horizontally and bitlines vertically, forming a grid-like struc- ture that allows for efficient data access and management.

During read operations, the memory sub-system control- ler 115 activates the appropriate wordline for the row where selected data is stored, causing the cells along the wordline to output data to the corresponding bitlines, which are then read by sense amplifiers. For writing data, the memory sub-system controller 115 applies a voltage to the cells along the wordline to change a state of the cells, representing the data being written. Erasing data occurs at the block level, where all wordlines in the block are activated contempora- neously, and a high voltage (e.g., a logical '0') is applied to reset all the cells in the block to a default state. Each activation for reading, writing or erasing gradually wears down the memory cells connected to a wordline, leading to potential wear-out and failure, making the management of wordlines needed for the longevity of the memory device.

Wordlines of the memory device 130 and the memory device 140 can be categorized as "strong", "medium" or "weak" in reference to an associated relative reliability and susceptibility to errors. Strong wordlines exhibit high reli- ability with low error rates, maintaining performance over many cycles due to superior manufacturing, optimal place- ment or resilient materials. Conversely, weak wordlines are prone to higher rates of errors and faster degradation, often due to manufacturing variances, physical location within the memory array or higher operational stress. The memory sub-system controller 115 manages these variations by applying more aggressive error-correcting codes (ECC) and wear-leveling algorithms to distribute write and erase cycles evenly, thereby curtailing the impact of weak wordlines and enhancing the overall longevity and reliability of the memory device 130 and/or the memory device 140. In some examples, the local memory 119 includes registers that store data identifying wordlines as strong or weak (or medium in some examples). In such a situation, the local memory can be preprogrammed with the addresses of the weak wordlines of the memory device 130 and the memory device 140. Additionally, the memory sub-system controller 115 can modify these registers to change a status (e.g., from strong to weak) of wordlines that degrade over time.

In various examples, the memory sub-system 110 includes an error-handling module 113 that executes a first-level error-handling algorithm 118 and a second-level error-handling algorithm 121. In some examples, the memory sub-system controller 115 includes at least a portion of the error-handling module 113. In some examples, the first error-handling module 113 and/or is part of the host system 120, an application or an operating system. In other examples, a local media controller 135 includes a portion of the error-handling module 113 and/or is configured to per- form the functionality described herein.

The first-level error-handling algorithm 118 executes a first-level LDPC decoder on a first-level codeword [U,P1] read from a page of the memory device(s) 130. In the examples described, it is presumed that the first-level code- word [U,P1] has a total bit size of N1, where N1 is an integer greater than one. Additionally, the user data [U] has a bit size of K1, where K1 is an integer greater than one and less than N1. The first-level parity [P1] has a bit size of L1, where L1 is an integer greater than one. Moreover, L1 is calculated using Equation 1.

$$L1 = N1 - K1 \qquad \text{Equation 1:}$$

The first-level error handling algorithm 118 causes the first-level LDPC decoder to employ a first-level of an H matrix to attempt to decode the first-level codeword [U,P1] that includes user data [U] and first-level parity [P1]. The first-level error-handling module 113 is configured to acti- vate the second-level error-handling algorithm 121 in response a determination that the first-level LDPC decoder was unable to correct errors in the first-level codeword [U,P1] before reaching a first-level decoding threshold (e.g., a maximum number of iterations) for a weak wordline. The second-level error-handling algorithm 121 is configured to read a second-level parity [P2] for the first-level codeword [U,P1].

FIG. 2 illustrates a chart 200 that represents an example of a portion of the memory device 130. In the example illustrated, the memory device 130 is a TLC, such that each cell of the memory device stores 3 bits of data. In the chart 200, there are 2 sub-blocks, SB0 and SB1 on a plane, PLANE 0 of the memory device 130. Each sub-block includes 3 pages, a lower page, LP, an upper page, UP and an extra page, XP. Each page stores 4 codewords, such that there are 12 codewords in the two sub-blocks SB0 and SB1. In some examples, each page, LP, UP and XP hold 16 kilobytes (KB) of data, and each codeword has a length of 4 KB. In the chart 200, 11 of these codewords 0 . . . 10 have user data and first-level parity [U,P1]. Additionally, the fourth codeword of the extra page, CW3, XP is a parity codeword, PCW. The parity codeword PCW stores a second- level parity [P2] for codewords 0 . . . 10 as user data, and includes first-level parity for the parity codeword, such that the parity codeword, PCW is a first level codeword. In other examples of two level LDPC scheme, the parity codeword, PCW can be stored at another page, plane, block, die, etc. of the memory device 130.

Referring back to FIG. 1, the second-level error-handling algorithm 121 combines the second-level parity [P2] with the first-level codeword [U,P1] to form a second-level codeword [U,P1,P2]. The user data [U] of the second-level codeword [U,P1, P2] has a bit size of K2, where K2 is an integer greater than one. In general, K2 and K1 are equal sizes. Additionally, the second-level codeword [U,P1, P2] has L2 number of additional parity bits, wherein L2 is an integer greater than one. Additionally, the second-level codeword [U,P1, P2] has a bit size of N2, where N2 is an integer greater than N1. N2 and L2 can be calculated with Equations 2 and 3, respectively.

$$N2 = N1 + L2 \qquad \text{Equation 2:}$$

$$L2 = (N2 - K2) - L1 \qquad \text{Equation 3:}$$

By examining Equations 1-3, in situations where K2 and K1 are equal, it is apparent that the number of additional parity bits, L2 in the second-level codeword [U,P1, P2] is equal to the bit size of the second-level parity [P2].

The second-level error-handling algorithm 121 executes a second-level LDPC decoder on the second-level codeword [U,P1, P2]. More particularly, the second-level LDPC decoder employs a second-level of the H matrix to attempt to decode the second-level codeword [U,P1, P2] that includes the user data [U], the first-level parity [P1] and the second parity level. The second-level of the H matrix includes additional parity-checks that increases the error correction capability of the second-level LDPC decoder relative to the first-level LDPC decoder to improve the chances of successfully decoding (correcting errors) in the second-level codeword [U, P1, P2] prior to reaching a second-level decoding threshold (e.g., defining a maximum number of iterations) for a weak wordline.

Figures 3A, 3B:
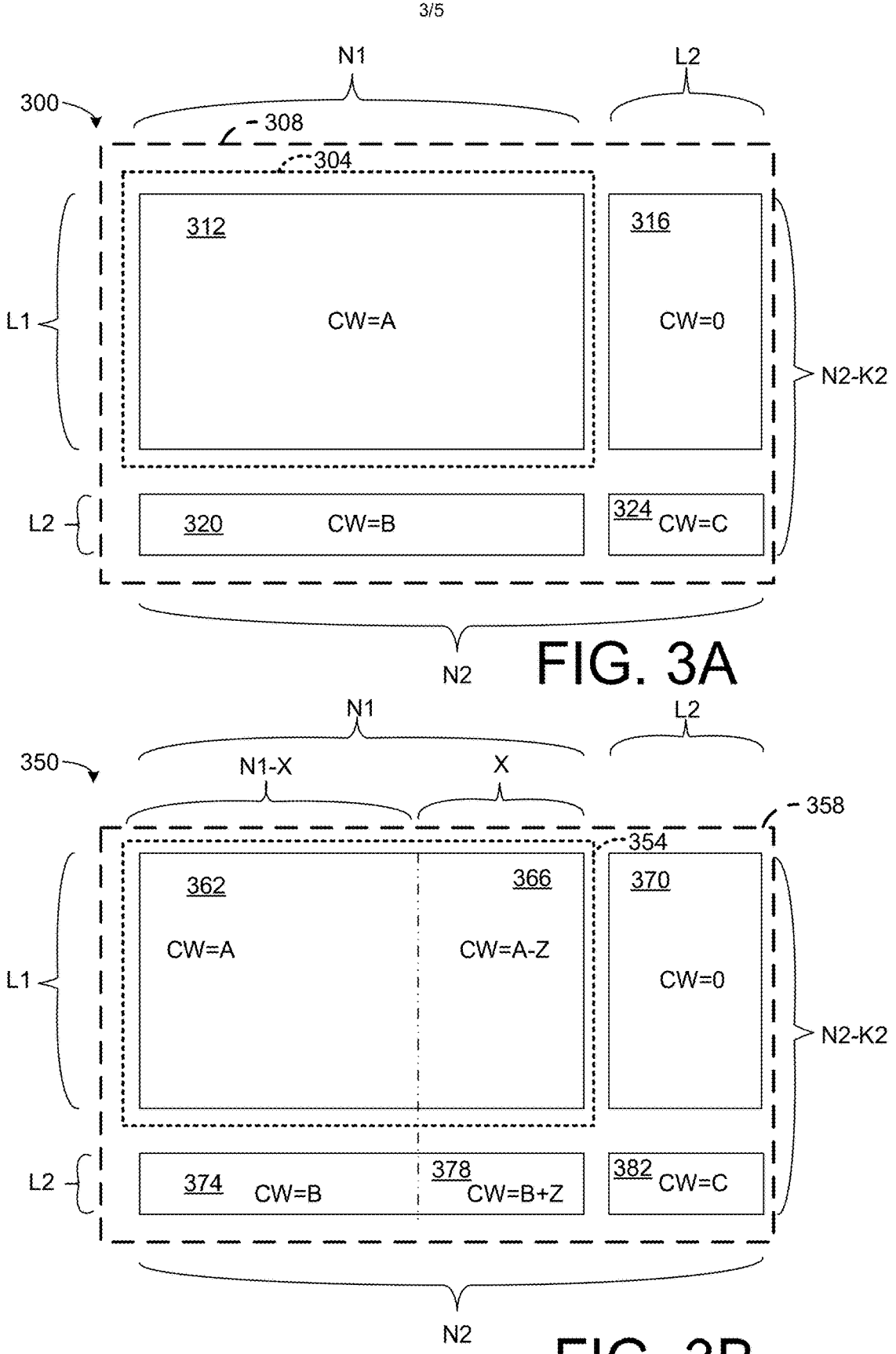
FIG. 3A illustrates a first example of a two-level H matrix.
FIG. 3B illustrates a second example of a two-level H matrix that includes a first-level H matrix and a second-level H matrix with modified average row weights.

FIG. 3A illustrates a first example of a two-level H matrix 300 that includes a first-level H matrix 304 and a second-level H matrix 308. As illustrated, the first-level H matrix 304 is a subset of the second-level H matrix 308. The two-level H matrix 300 includes 4 partitions, a first partition 312, a second partition 316 a third partition 320 and a fourth partition 324. In the two-level H matrix 300, the first partition 312 has a column weight of A (CW=A), the second partition has a column weight of zero (CW=0), the third partition 320 has a column weight of B (CW=B) and the fourth partition 324 has a column weight of C (CW=C), where A, B and C are positive integers. The second-level H matrix 308 has a first level that includes the first partition 312, and a second level that includes a combination of the second partition 316, third partition 320 and the fourth partition 324.

The column weight refers to the number of '1's present in a specific column of the corresponding partition of the two-level H matrix 300. The column weight is employed to define a relationship between codeword bits and parity-checks of the LDPC decoder (the first-level LDPC decoder and the second-level LDPC decoder). More generally, each row in the first-level H matrix 304 and the second-level H matrix 308 corresponds to a parity-check equation, and each column corresponds to a codeword bit. The column weight indicates how many parity-checks include a particular codeword bit, influencing both the error correction capability and the complexity of the decoding process. Greater column weights indicate that a codeword bit is involved in more parity-checks.

The first partition 312 has N1 number of columns, and L1 number of rows. The second partition 316 has L2 number of columns and L1 number of rows. The third partition 320 has N1 number of columns and L2 number of rows. The fourth partition 324 has L2 number of columns and L2 number of rows. There are N2−K2=L1+L2 number of rows in the two-level H matrix 300, which is the number of parity bits in the second-level codeword [U,P1,P2]. Moreover, there are N2=N1+L2 number of columns in the two-level H matrix 300, which is the number of bits in the second-level codeword [U,P1,P2].

As noted, the first-level error-handling algorithm 118 causes the first-level LDPC decoder to attempt to decode the first-level codeword [U,P1] using the first-level H matrix, such as the first-level H matrix 304. Further, the second-level error-handling algorithm 121 causes the second-level LDPC decoder to attempt to decode the second-level codeword [U, P1, P2] using the second-level H matrix, such as the second-level H matrix 308.

The column weight for the first partition 312, the second partition 316, the third partition 320 and the fourth partition 324 is selected to balance error correction capability with performance. In some examples, the column weight, A for the first partition 312 is selected to be less than 6 (e.g., A<6) for a greater error correction capability.

Additionally, because the higher column weights lead to longer processing times, and lower performance, the column weight B of the third partition 320 should be selected to be small (e.g., B=1). Accordingly, the column weight of the second-level H matrix 308 is equal to the sum of A and B (e.g., A+B).

The row weight of the first-level H matrix 304 and the second-level H matrix 308 is defined as the number of '1's in a given row of the corresponding H matrix. The row weight indicates how many codeword bits are involved in the parity-check equation represented by that row. A higher row weight indicates that more bits are checked together, which can impact the error detection and correction capabilities of the LDPC code. Each '1' in a row indicates that the corresponding codeword bit is included in the parity-check. Additionally, if a sum (modulo 2) of the bits indicated by the '1's in a row does not equal zero, an error is detected. The row weight impact the complexity and performance of the first-level error-handling algorithm 118 (implementing the first-level LDPC decoder) and the second-level error-handling algorithm 121 (implementing the second-level LDPC decoder).

The average row weight for the first-level H matrix 304 can be approximated with Equation 4. The average row weight for the second-level H matrix 308 can be approximated with Equation 5. Additionally, a total number of non-zero bits, of the third partition 320 can be calculated with Equation 6.

$$RW(L1) \approx N1 * A/L1 \qquad \text{Equation 4:}$$

$$RW(L2) \approx N1 * B/L2 + C \qquad \text{Equation 5:}$$

$$NZ(L2) = N1 * B \qquad \text{Equation 6:}$$

wherein:
  RW(L1) is the average row weight of the first partition 312;
  RW(L2) is the average row weight of the second level of the second-level H matrix 308 formed with a combination of the third partition 320 and the fourth partition 324; and
  NZ(L2) is the total number of non-zero bits (e.g, '1's) in the third partition.

Table 1 demonstrates example values of column weights for the two-level H matrix 300 that are calculated using Equations 4 and 5.

TABLE 1

| Variable | A | B | C | N1 | L1 | L2 | L1(RW) | L2(RW) |
|---|---|---|---|---|---|---|---|---|
| Value 1 | 4 | 1 | 5 | 300 | 33 | 10 | 36.36 | 35.00 |
| Value2 | 4 | 1 | 5 | 300 | 33 | 20 | 36.36 | 20.00 |

As demonstrated by Equation 6, the number of non-zero bits in the third partition 320 used for the second-level H matrix 308 is independent of the number of parity bits, L2 in the second-level parity [P2]. Additionally, as demonstrated by Table 1, in situations where L2 increases, RW(L2) decreases and RW(L1) remains constant. Accordingly, as the number of parity bits in the second-level parity [P2], L2 increases, the average row weight of the combination of the third partition 320 and the fourth partition 324, RW(L2) decreases, which might result in a loss of error correction capability for the second-level H matrix 308. Stated differently, the second-level of the two-level H matrix 300, namely the combination of the third partition 320 and the fourth partition 324 has an average row weight, RW(L2) that decreases as the number bits in the second-level parity [P2], L2 increases. Moreover, in situations where the average row weight of the second level of the two-level H matrix 350, RW(L2) is significantly less than the average row weight of the first partition 312, RW(L1) (e.g., RW(L2)<<RW(L1)) causes non-uniform row weight distribution about the two-level H matrix 300. This non-uniform row weight distribution might cause the second-level H matrix 308 to have a lower correction capability as compared to a single-level H matrix with uniform row weight distribution and the same column weight.

To curtail the non-uniform row weight distribution, the column weights A, B and C of the two-level H matrix 300 can be adjusted. In some examples, the column weight C of the fourth partition 324 is increased, and the average row RW(L2) of the second level of the two-level H matrix 350 is also increased, which can improve error correction capability of the second-level H matrix 308.

Additionally or alternatively, the column weight A of the first partition 312 is decreased, and the column weight B of the third partition 320 is correspondingly increased. This results in a decrease in the average row weight for the first partition 312, RW(L1) (corresponding to the first-level H matrix 304) and an increase in the average row weight for the second-level of the second-level H matrix 308, RW(L2). FIG. 3B illustrates this concept. More particularly, FIG. 3B illustrates a second example of a two-level H matrix 350 that includes a first-level H matrix 354 and a second-level H matrix 358. The two-level H matrix 350 is a modified version of the two-level H matrix 300, such that the first-level H matrix 354 corresponds to the first-level H matrix 304 and the second-level H matrix 358 corresponds to the second-level H matrix 308.

The first-level H matrix 354 includes 2 partitions, namely a first partition 362 and a second partition 366 of the two-level H matrix 350. The second-level H matrix 358 has 6 partitions, namely, the first partition 362, the second partition 366, the third partition 370, a fourth partition 374, a fifth partition 378 and a sixth partition 382. Relative to the first partition 312 of the two-level H matrix 300, the first partition 362 and the second partition 366 represent sub-partitions of the first partition 312. Similarly, relative to the third partition 320 of the two-level H matrix 300, the fourth partition 374 and the fifth partition 378 are sub-partitions of the third partition 320. In particular, combined, the first partition 362 and the second partition 366, as well as the fourth partition 374 and the fifth partition 378 have N1 number of columns, which corresponds to the bit size of the first-level codeword [U,P1, P2]. Moreover, the second partition 372 and the fifth partition 378 have X number of columns, where X is a positive integer. Thus, the first partition 362 and the fourth partition 374 have N1–X number of columns. The second-level H matrix 358 has a first level formed of a combination of the first partition 362, the second partition 366 and the third partition 370, and a second level formed of a combination of the fourth partition 374, the fifth partition 378 and the sixth partition 382.

In the two-level H matrix 350, the first partition 362 has a column weight of A, and the second partition 366 has a column weight of A-Z, where Z is a positive integer. Thus, the first-level H matrix 354 has a portion (e.g., the second partition 366) with a decreased column weight. Correspondingly, in the two-level H matrix 350, the fourth partition 374 has a column weight of B, and the fifth partition 378 has a column weight of B+Z. Thus, the second-level H matrix 358 has a portion with an increase column weight. That is, the column weight of the second partition 366 is reduced by Z, and the column weight of the fifth partition 378 is increased by Z. Accordingly, the absolute difference, |Z|, between the column weight of the second partition 366 and the column weight of the first partition 362 is equal to the absolute difference, |Z| in the column weight of the fifth partition 378 and the fourth partition 374. The column weight of the third partition 370 is zero, the same as the column weight of the second partition 316 of the two-level H matrix 300. Also, the column weight of the sixth partition 382 is C, the same as the column weight of the fourth partition 324 of the two-level H matrix 300.

The values for C, X and Z are selected to tune the performance of the first-level LDPC decoder executed by the error-handling module first-level error-handling algorithm 118 and the second-level error-handling algorithm 121. Equation 7 is employable for approximating the average row weight for the combination of the first partition 362 and the second partition 366. Equation 8 is employable to approximate the average row weight for the second level of the second-level H matrix 358 formed with the combination of the fourth partition 374, the fifth partition 378 and the sixth partition 382.

$$RW(L1)' \approx [(N1-X)*A+X(A-Z)]/L1 \qquad \text{Equation 7:}$$

$$RW(L2)' \approx [(N1-X)*B+X(B+Z)]/L2+C \qquad \text{Equation 8:}$$

wherein:

RW(L1)' is the average row weight of a combination of the first partition 362 and the second partition 366; and RW(L2)' is the average row weight of the second level of the second-level H matrix 358 (a combination of the fourth partition 374, the fifth partition 378 and the sixth partition Table 2 demonstrates example values of column weights for the two-level H matrix 300 that are calculated using Equations 4 and 5.

TABLE 2

| Variable | A | B | C | N1 | L1 | L2 | Z | X | L1(RW)' | L2(RW)' |
|---|---|---|---|---|---|---|---|---|---|---|
| Value | 4 | 1 | 5 | 300 | 33 | 10 | 1 | 10 | 36.06 | 36.00 |

In comparison to Table 1, as demonstrated in Table 2, by selecting a value of 1 for Z (representing a change in column weight of the second partition 366 and the fifth partition 378), and 100 for X (representing a number of columns in the second partition 366 and the fifth partition 378), the average row weight of the second level of the second-level H matrix 358, RW(L2)' is increased to 36.00 (from 20.00 for RW(L2) of Table 1) for an L2 value of 23. Correspondingly, the average row weight of a combination of the first partition 362 and the second partition 366 is decreased to 36.06 (from 36.36 for RW(L1) of Table 1). Accordingly, the values of X, Z and C are adjustable to achieve a desired value of RW(L2)' to meet performance thresholds for the second-level error-handling algorithm 121. The performance thresholds for the second-level error-handling algorithm 121 could be, for example, a data throughput speed and/or error correction capability of the second-level error-handling algorithm 121. Additionally, by decreasing RW(L1)', the data throughput of the first-level error-handling algorithm 118 can increase at a cost of error correction capability, because the column weight of the second partition 366 forming the first-level H matrix 304 is decreased.

It is noted that the values provided in Table 1 and Table 2 are only one example. However, Equations 7-8 are employable to tune the values of X, Z and C to achieve a desired value for RW(L2)' and RW(L1)'. However, in each such example, modifying the column weights of the second partition 366 and the fifth partition 378 causes the first-level H matrix 354 to be an irregular LDPC matrix because the second partition 366 has a different column weight than the first partition 362. Additionally, after adjusting the column weights to achieve the RW(L2)' and RW(L1)', the second-level H matrix 358 may also be an irregular LDPC matrix because of the sixth partition 382. More generally, because the second-level H matrix 358 encompasses the first-level H matrix 354, reducing the column weight of the second partition 366 by Z, and increasing the column weight of the fifth partition 378 by Z (both having X number of columns), the column weight of the second-level H matrix 358 is the same for every column. If C (the column weight of the sixth partition 382) is different than A+B (the column weight of the remaining portion of the second-level H matrix 359), then the second-level H matrix 358 has different column weights for different portions. Therefore, the second-level H matrix 358 is an irregular H matrix, and there is uneven distribution of the column weights, which causes the change in the average row weights, RW(L2)' and RW(L1)'. However, if C is equal to A+B, the second-level H matrix 358 could be a regular H matrix.

In operation, in response to receiving a read command from the host system 120, the memory sub-system controller 115 initiates a read operation of a first-level codeword [U, P1] from a page of the memory device 130. It is noted that the read command can specify request data from multiple pages of the memory device(s) 130, but the operations for processing a single codeword (the first-level codeword [U,P1]) are described in detail. The memory sub-system controller 115 initiates the error-handling module 113 to decode the first-level codeword [U,P1]. In response, the error-handling module 113 calculates a syndrome vector to determine if the first-level codeword [U,P1] contains errors. If the syndrome vector has a value of zero, the user data [U] can be extracted from the first-level codeword [U,P1] and stored in the local memory 119. Alternatively, in some examples, an entirety of the first-level codeword [U,P1] is stored in the local memory 119.

Conversely, if the syndrome vector has a non-zero value, there are errors present in the first-level codeword [U,P1]. Responsive to detecting such errors, the error-handling module 113 activates the first-level error-handling algorithm 118. The first-level error-handling algorithm 118 inputs the first-level codeword [U,P1] into a first-level LDPC decoder (e.g., the first-level H matrix 354) that employs a first-level H matrix with decreased average row weights (e.g., RW(L1)') to attempt to correct the errors in the first-level codeword [U,P1].

If the first-level LDPC decoder fails to correct the errors before reaching a specified first-level decoding threshold (e.g., defining a maximum number of iterations of the LDPC decoder or other criteria) particularly for weak wordlines, the error-handling module 113 activates a second-level error-handling algorithm 121. The second-level error-handling algorithm 121 causes the memory sub-system controller 115 to read the second-level parity [P2] for the first-level codeword [U,P1]. Moreover, as illustrated in FIG. 2, the second-level parity [P2] can be stored in a separate page from the first-level codeword [U,P1]. The second-level error-handling algorithm 121 combines the first-level codeword with the second-level parity [P2] to form a second-level codeword [U,P1, P2]. The second-level error-handling algorithm 121 inputs this second-level codeword [U,P1, P2] into a second-level LDPC decoder. This second-level LDPC decoder employs a second-level H matrix that incorporates modified column weights, designed to increase the average row weight of the second-level H matrix. The second-level H matrix could be, for example, the second-level H matrix 358 of FIG. 3B, wherein RW(L2)' has been increased to increase an error correction capability of the second-level H matrix 358.

If the second-level LDPC decoder successfully corrects the errors, the corrected data is stored in the local memory 119 by the second-level error-handling algorithm 121. This corrected data stored in the local memory 119 could be the user data [U] or an entirety of the second-level codeword [U,P1,P2]. Additionally, the user data [U] is provided to the host system 120. This process ensures robust error correction and data integrity, even when faced with challenging error patterns or degraded memory cells in the memory devices 130. If the second-level LDPC decoder cannot successfully correct the errors before reaching a second-level decoding threshold that defines a maximum number iterations of the LDPC decoder or other criteria, the error-handling module 113 can execute remedial measures, such as reporting a failure for the read command and/or executing other error correction operations.

By utilizing this two-level H matrix with modified average row weights in both levels of the H matrix for decoding LDPC codewords, the system 100 adapts to varying error conditions and maintains data accuracy and reliability. The adjustment of column weights tunes the average row weights in both levels of the H matrix, and enhances the overall error correction capability of the system, particularly for weaker wordlines that are more susceptible to errors.

Figure 4:
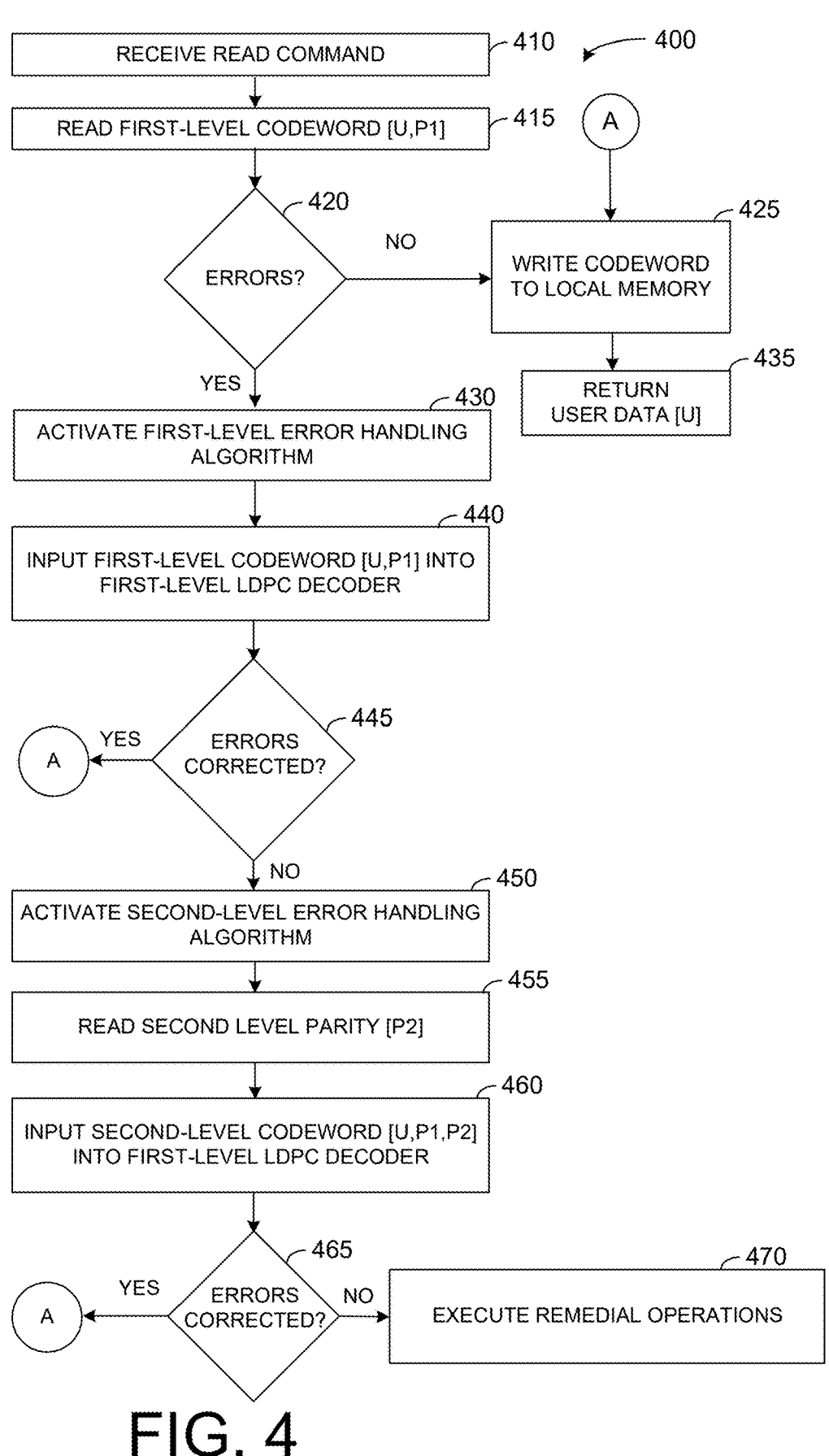
FIG. 4 illustrates a flowchart of an example method for processing a read command.

FIG. 4 illustrates a flowchart of an example method 400 for executing a read operation. The method 400 can be implemented, for example, by a memory sub-system controller (e.g., the memory sub-system controller 115). At block 410, a memory controller receives the read command from a host system (e.g., the host system 120). In response, at block 415 the memory controller reads a first-level codeword [U,P1] from a memory page of a memory device (e.g., the memory device 130). It is noted that the read command can specify request data from multiple pages of the memory device(s) 130, but the operations for processing a single codeword (the first-level codeword [U,P1]) are described in detail. Also at block 415, the memory sub-system controller initiates an error-handling module (e.g., the error-handling module 113) to decode the first-level codeword [U,P1]. In response, at block 420, the error-handling module makes a determination as to whether the first-level codeword [U, P1] has at least one error. To make the determination, the error-handling module calculates a syndrome vector for the first-level codeword [U,P1] based on a first-level H matrix (e.g., the first-level H matrix 354). If the syndrome vector has a value of zero, the determination at block 420 is negative (e.g., NO), and the method 400 proceeds to block 425. If the syndrome vector is non-zero, the determination at block 420 is positive (e.g., YES), and the method 400 proceeds to block 430.

At block 425, a codeword with no errors (which could be a first-level codeword or a second-level codeword) is written to local memory (e.g., the local memory 119). At block 435, the user data [U] can be extracted from the codeword and returned to the host system as a response to the read command. Alternatively, in some examples, an entirety of the codeword is returned to the host system.

At block 430, the error-handling module activates a first-level error-handling algorithm (e.g., the first-level error-handling algorithm 118). At block 440, the first-level error-handling algorithm inputs the first-level codeword [U,P1] into a first-level LDPC decoder that employs a first-level H matrix (e.g., the first-level H matrix 354) with decreased average row weights (e.g., RW(L1)') to attempt to correct the errors in the first-level codeword [U,P1]. The first-level decoder can be executed for multiple iterations in an attempt to correct the errors of the first-level codeword [U,P1].

At block 445, the first-level error-handling algorithm makes a determination as to whether the first-level LDPC decoder is able to correct the errors in the first-level codeword [U,P1] prior to reaching a first-decoding threshold that could define a maximum number of iterations (or other criteria) for the first-level LDPC decoder. If the errors are corrected, the determination at block 445 is positive (e.g., YES), and the method proceeds to node A that flows to block 425. If errors remain in the first-level codeword [U,P1], the determination at block 445 is negative (e.g., NO), and the method 400 proceeds to block 450.

At block 450, the error-handling module 113 activates a second-level error-handling algorithm (e.g., the second-level error-handling algorithm 121). At block 455, the second-level error-handling algorithm causes the memory sub-system controller to read a second-level parity [P2] for the first-level codeword [U,P1]. Also at block 455, the second-level error-handling algorithm combines the first-level codeword [U,P1] with the second-level parity [P2] to form a second-level codeword [U,P1,P2]. At block 460, the second-level error-handling algorithm inputs this second-level codeword [U,P1, P2] into a second-level LDPC decoder. This second-level LDPC decoder employs a second-level H matrix (e.g., the second-level H matrix 358) that incorporates modified column weights, designed to increase the average row weight of a portion of the second-level H matrix. The second-level decoder can be executed for multiple iterations.

At block 465, the second-level error-handling algorithm makes a determination as to whether the second-level LDPC decoder has successfully corrected the errors before reaching a second-level decoding threshold, which could define a maximum number of iterations (or other criteria). If the errors in the second-level codeword [U,P1, P2] are corrected, the determination at block 465 is positive (e.g., YES), and the method 400 proceeds to node A. If the determination at block 465 is negative (e.g., NO), the method 400 proceeds to block 470. At block 470, the error handling module executes remedial measures, such as reporting a failure for the read command and/or executing other error correction operations.

Figure 5:
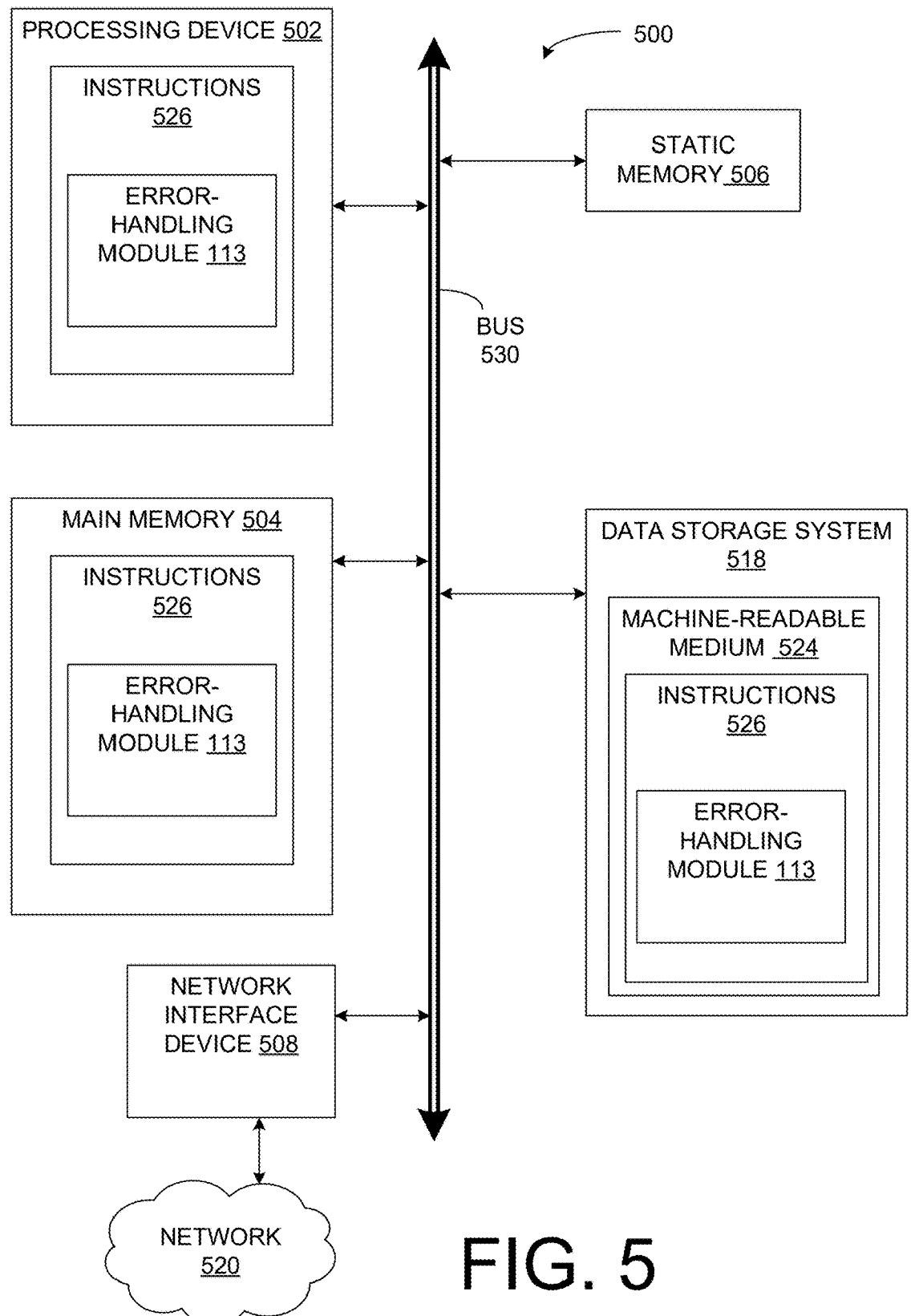
FIG. 5 illustrates an example of a computer system (a machine) in which examples of the present description may operate.

FIG. 5 illustrates an example machine of a computer system 500 (a machine) within which a set of instructions, for causing the machine to perform any one or more of the methodologies discussed herein, can be executed. In some examples, the computer system 500 corresponds to a host system (e.g., the host system 120 of FIG. 1) that includes, is coupled to, or utilizes a memory sub-system (e.g., the memory sub-system 110 of FIG. 1) or is used to perform the operations of a controller (e.g., to execute an operating system to perform operations corresponding to the error-handling module 113 of FIG. 1). In other examples, the machine is connected (e.g., networked) to other machines in a LAN, an intranet, an extranet and/or the Internet. In various examples, the machine operates in the capacity of a server or a client machine in client-server network environment, as a peer machine in a peer-to-peer (or distributed) network environment or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge or any machine capable of executing a set of instructions (sequential or otherwise) that specify actions to be taken by that machine. In other examples, the machine may be a computer within an automotive, a data center, a smart factory or other industrial application. Further, while a single machine is illustrated, the term "machine" shall also be taken to include any collection of machines that individually or jointly execute a set (or multiple sets) of instructions to perform the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM) or other non-transitory computer-readable media) and a data storage system 518, which communicate with each other via a bus 530.

The processing device 502 represents one or more general-purpose processing devices such as a microprocessor, a central processing unit, etc. More particularly, the processing device 502 can be a complex instruction set computing (CISC) microprocessor, reduced instruction set computing (RISC) microprocessor, very long instruction word (VLIW) microprocessor or a processor implementing other instruction sets or processors implementing a combination of instruction sets. In some examples, the processing device 502 is implemented with a special-purpose processing devices such as an application specific integrated circuit (ASIC), a field programmable gate array (FPGA), a digital signal processor (DSP), network processor, etc. The processing device 502 is configured to execute instructions 526 for performing the operations discussed herein. In some examples, the computer system 500 includes a network interface device 508 to communicate over the network 520.

The data storage system 518 includes a machine-readable storage medium 524 (also known as a computer-readable medium) that store sets of instructions 526 or software for executing the methodologies and/or functions described herein. The machine-readable storage medium 524 is a non-transitory medium. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518 and/or main memory 504 can correspond to the memory sub-system 110 of FIG. 1. Accordingly, the machine-readable storage medium 524, the data storage system 518 and/or the main memory 504 are examples of non-transitory computer-readable media.

In some examples, the instructions 526 include instructions to implement functionality corresponding to the error-handling module 113 of FIG. 1). While the machine-readable storage medium 524 is shown in an example to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared and otherwise manipulated. It has proven convenient at times, principally for reasons of common usage, to refer to these signals as bits, values, elements, symbols, characters, terms, numbers, etc.

It is noted, however, that all of these and similar terms are to be associated with the appropriate physical quantities and are merely convenient labels applied to these quantities. This description can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

This description also relates to an apparatus for performing the operations herein. This apparatus can be specially constructed for the intended purposes or this apparatus can include a general purpose computer selectively activated or reconfigured by a computer program stored in the computer. Such a computer program can be stored in a computer readable storage medium, such as, but not limited to, any type of disk including floppy disks, optical disks, CD-ROMs, magnetic-optical disks, read-only memories (ROMs), random access memories (RAMs), EPROMs, EEPROMs, magnetic or optical cards or any type of media suitable for storing electronic instructions, each coupled to a computer system bus.

The algorithms and displays presented herein are not inherently related to any particular computer or other apparatus. Various general purpose systems can be used with programs in accordance with the descriptions herein, or it can prove convenient to construct a more specialized apparatus to perform the method. In addition, the present disclosure is not described with reference to any particular programming language. It will be appreciated that a variety of programming languages can be used to implement the teachings of the disclosure as described herein.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications and variations that fall within the scope of this application, including the appended claims. As used herein, the term "includes" means includes but not limited to, the term "including" means including but not limited to. The term "based on" means "based at least in part on". Additionally, where the disclosure or claims recite "a," "an," "a first" or "another" element, or the equivalent thereof, it should be interpreted to include one or more than one such element, neither requiring nor excluding two or more such elements.

What is claimed is:

1. A method for error correction in a memory system, comprising:

reading, by a memory controller, a first-level codeword from a memory device, the first-level codeword comprising user data and first-level parity data;

decoding, by the memory controller responsive to determining the first-level codeword contains errors, the first-level codeword using a first-level low-density parity-check (LDPC) decoder employing a first-level H matrix having a portion with reduced column weights to reduce an average row weight of the first-level H matrix; and in response to the first-level LDPC decoder failing to correct the errors in the first-level codeword prior to a specified threshold, decoding, by the memory controller, a second-level codeword using a second-level LDPC decoder employing a second-level H matrix having a portion with increased column weights to increase an average row weight of a second-level of the second-level H matrix, wherein the second-level codeword comprises the user data, the first-level parity data and second-level parity data.

2. The method of claim 1, wherein the first-level H matrix comprises a first partition with a first column weight and a second partition with a second column weight, wherein the second column weight is less than the first column weight to provide the portion of the first-level H matrix with reduced column weights.

3. The method of claim 2, wherein the second-level H matrix comprises the first-level H matrix and additional partitions, wherein the additional partitions comprise a third partition with a third column weight and a fourth partition with a fourth column weight, wherein the fourth column weight is greater than the third column weight to provide the portion of the second-level H matrix with increase column weights.

4. The method of claim 3, wherein an absolute difference between the first column weight and the second column weight is equal to an absolute difference between the third column weight and the fourth column weight.

5. The method of claim 2, wherein the second-level H matrix further comprises a fifth partition having a column weight greater than zero and less than or equal to 9.

6. The method of claim 1, wherein the second-level parity data is stored in a separate page from the first-level codeword in the memory device.

7. The method of claim 1, wherein the average row weight of the second-level of the second-level H matrix decreases as a bit size of the second-level parity data increases.

8. The method of claim 1, further comprising:

storing data from the second-level codeword in a local memory in response to the second-level LDPC decoder successfully correcting the errors; and providing the user data of the second-level codeword to a host system.

9. The method of claim 1, wherein the first-level H matrix is an irregular LDPC matrix.

10. A system for decoding data stored in a memory device, comprising:

a memory device; and a processing device coupled to the memory device, the processing device to perform operations comprising:

reading a first-level codeword from the memory device, the first-level codeword comprising user data and first-level parity data;

decoding the first-level codeword using a first-level low-density parity-check (LDPC) decoder employing a first-level H matrix having a portion with reduced column weights to reduce an average row weight of the first-level H matrix to correct errors in the first-level codeword; and in response to the first-level LDPC decoder failing to correct the errors in the first-level codeword prior to a specified threshold, decoding a second-level codeword using a second-level LDPC decoder employing a second-level H matrix having a portion with increased column weights to increase an average row weight of a second-level of the second-level H matrix, wherein the second-level codeword comprises the user data, the first-level parity data and second-level parity data.

11. The system of claim 10, wherein the first-level H matrix comprises a first partition with a first column weight and a second partition with a second column weight, wherein the second column weight is less than the first column weight to provide the portion of the first-level H matrix with reduced column weights.

12. The system of claim 11, wherein the second-level H matrix comprises the first-level H matrix and additional partitions, the additional partitions comprising a third partition with a third column weight and a fourth partition with a fourth column weight, and the fourth column weight is greater than the third column weight to provide the portion of the second-level H matrix with increase column weights.

13. The system of claim 12, wherein an absolute difference between the first column weight and the second column weight is equal to an absolute difference between the third column weight and the fourth column weight.

14. The system of claim 12, wherein the second-level H matrix further comprises a fifth partition having a column weight greater than zero and less than or equal to 9.

15. The system of claim 10, wherein the second-level parity data is stored in a separate page from the first-level codeword in the memory device.

16. The system of claim 10, wherein the first-level H matrix is an irregular LDPC matrix.

17. A non-transitory computer-readable storage medium comprising instructions that, when executed by a processing device, cause the processing device to perform operations comprising:

reading, by a memory controller, a first-level codeword from a memory device, the first-level codeword comprising user data and first-level parity data;

decoding, by the memory controller, the first-level codeword using a first-level low-density parity-check (LDPC) decoder employing a first-level H matrix having a portion with reduced column weights to reduce an average row weight of the first-level H matrix responsive to determining that the first-level codeword contains errors; and in response to the first-level LDPC decoder failing to correct the errors in the first-level codeword prior to a specified threshold, decoding, by the memory controller, a second-level codeword using a second-level LDPC decoder employing a second-level H matrix having a portion with increased column weights to increase an average row weight of a second-level of the second-level H matrix, wherein the second-level codeword comprises the user data, the first-level parity data and second-level parity data.

18. The non-transitory computer-readable storage medium of claim 17, wherein:

the first-level H matrix comprises a first partition with a first column weight and a second partition with a second column weight and the second column weight is less than the first column weight to provide the portion of the first-level H matrix with reduced column weights; and the second-level H matrix comprises the first-level H matrix and additional partitions, the additional partitions comprise a third partition with a third column weight and a fourth partition with a fourth column weight, the fourth column weight is greater than the third column weight to provide the portion of the second-level H matrix with increase column weights.

19. The non-transitory computer-readable storage medium of claim 18, wherein the second-level H matrix further comprises a fifth partition having a column weight greater than zero and less than or equal to 9.

20. The non-transitory computer-readable storage medium of claim 17, wherein the average row weight of the second-level of the second-level H matrix decreases as a bit size of the second-level parity data increases.

* * * * *